(12) United States Patent
Mizoe

(10) Patent No.: US 7,098,736 B2
(45) Date of Patent: Aug. 29, 2006

(54) AMPLIFIER CIRCUIT

(75) Inventor: Kimiyoshi Mizoe, Chiba (JP)

(73) Assignee: Fuji Electric Device Technology Co., Ltd., (JP)

( * ) Notice: Subject to any disclaimer, the term of this patent is extended or adjusted under 35 U.S.C. 154(b) by 405 days.

(21) Appl. No.: 10/760,705

(22) Filed: Jan. 16, 2004

(65) Prior Publication Data

US 2006/0125567 A1    Jun. 15, 2006

(30) Foreign Application Priority Data

Jan. 16, 2003    (JP)    ............................. 2003-007800

(51) Int. Cl.
*H03F 3/45*    (2006.01)
(52) U.S. Cl. ...................... 330/255; 330/261
(58) Field of Classification Search ................ 330/255, 330/257, 261, 69, 292
See application file for complete search history.

(56) References Cited

U.S. PATENT DOCUMENTS 4,800,339 A * 1/1989 Tanimoto et al. ........... 330/253
5,907,259 A * 5/1999 Yamada et al. ............. 327/563
6,542,034 B1 * 4/2003 Tomasini et al. ........... 330/264
6,828,855 B1 * 12/2004 Wang ......................... 330/253

FOREIGN PATENT DOCUMENTS

JP    8-222972 A    8/1996
JP    2688477 B2    8/1997

* cited by examiner

*Primary Examiner*—Henry Choe
(74) *Attorney, Agent, or Firm*—Rossi, Kimms & McDowell, LLP

(57) ABSTRACT

An amplifier circuit has a simple circuit architecture that enables a push-pull output function while exhibiting low power consumption. The amplifier circuit includes a first transconductance amplifier to which an output of a two-input differential amplifier and a first bias voltage are input. An output of the first transconductance amplifier is connected to another input and an output of a second transconductance amplifier, which has one input thereof connected to an output of the first transconductance amplifier and a gate of a first output transistor. The output of the differential amplifier is connected to a gate of a second output transistor, which has the polarity opposite to the polarity of the first output transistor. Drains of the first and the second output transistors are connected to each other thus constituting a push-pull output.

5 Claims, 7 Drawing Sheets

AMPLIFIER CIRCUIT

BACKGROUND OF THE INVENTION

The present invention relates to an amplifier circuit, and more particularly, to an amplifier circuit capable of performing a push-pull output and having a reduced power consumption, which is applied to a semiconductor integrated circuit for amplifying signals and performing impedance conversion.

An example of a conventional amplifier circuit capable of performing a push-pull output is shown in FIG. 6 and described in Japanese Patent Publication 2688477. In this amplifier, a PMOS transistor (QPf) and an NMOS transistor (Qnf) which adopt a complementary architecture are connected in a push-pull type configuration as final components of a class AB output stage or a class B output stage, wherein nodes thereof constitute output terminals (OUT) of the stage. Two transconductance amplifier circuits (Tp, Tn) have respective output terminals thereof connected to gate terminals of the PMOS transistor (Qpf) and the NMOS transistor (Qnf), have respective inverted input terminals thereof connected to each other thus forming an input (IN) of the amplifier, and have respective non-inverted input terminals thereof connected to the output terminals (OUT) through respective feedback systems (Fp, Fn).

In this example, although it is possible to have an advantage that the push-pull output operation can be surely performed, since the feedback is applied to the gate of the MOS transistor at the output stage from the output through the feedback systems and the transconductance amplifier, there exist characteristics that when the amplifier is applied to the operational amplifier, the stability cannot be ensured and the frequency characteristics deteriorate.

A second example of a conventional differential amplifier is shown in FIG. 7 and described in Japanese Unexamined Patent Publication 1996-222972. The amplifier includes a differential input stage (38), an output stage (40) and a in-phase feedback stabilizing circuit (42). The differential input stage (38) is constructed by respectively connecting transistors (Q3, Q4) as loads to two transistors (Q1, Q2) which constitute amplifying elements thereof. The output stage (40) is constituted of a transistor (Q10) which inputs an output of one transistor (Q1) of the differential input stage (38), a transistor (Q11) which is connected to the transistor (Q10) as a load, a transistor (Q12) which constitutes a current mirror circuit together with the transistor (Q11) and a transistor (Q13) which inputs an output of another transistor (Q2) of the differential input stage, wherein the transistor (Q12) and the transistor (Q13) constitute a push-pull output circuit and an output is taken out from a node thereof. Further, the in-phase feedback stabilizing circuit (42) is constituted of a transistor (Q8) which inputs an output of one transistor (Q1) of the differential input stage, a transistor (Q9) which inputs an output of another transistor (Q2) of the differential input stage, transistors (Q6, Q7) which are connected to these transistors (Q8, Q9) as common loads so as to constitute a current mirror circuit, and a transistor Q5 which is connected to the transistor (Q6) as a load and constitutes a current mirror circuit together with the transistors (Q3, Q4) which constitute loads of the differential input stage.

In this example, although the stability of the push-pull output circuit which constitutes the output stage can be ensured, since one transistor (Q12) which constitutes the output stage forms the current mirror circuit together with the transistor (Q11) and hence, there exists the characteristic that an output current is restricted by a bias current of the transistor (Q11).

When it is necessary to use signal outputs of the operational amplifier in a full voltage range between the first power source and the second power source or when it is necessary to increase an output current such that the operational amplifier can cope with a light load, the architecture of the output stage of the operational amplifier uses transistors having a complementary structure such as the PMOS transistor and the NMOS transistor and the push-pull output which can perform a class AB operation or a class B operation using the drain (collector in bipolar operation) output is performed and hence, it is possible to reduce the consumption of current of the operational amplifier in the still operation whereby a reduction of the power consumption can be realized.

However, when the push-pull output is adopted, to provide a stable operational amplifier in which an output voltage does not receive the influence of the fluctuation of output voltage and the fluctuation of temperature or the like, there has been a drawback that the bias control method of gates of the PMOS transistor and the NMOS transistor (bases in bipolar transistors) used in an output stage is difficult and hence, the circuit architecture of the output stage of the operational amplifier becomes complicated whereby current consumption is increased.

In view of the above, it would be desirable to provide an amplifier circuit which has a simple circuit architecture and is capable of performing a push-pull output function to obtain low power consumption.

SUMMARY OF THE INVENTION

To overcome the above-mentioned drawbacks, according to the present invention, an amplifier circuit having a differential amplifier for amplifying a difference signal between an inverted signal and a non-inverted signal includes a first transconductance amplifier which inputs an output of the differential amplifier and a first bias voltage therein and converts a difference signal between the output of the differential amplifier and the first bias voltage into a current signal and outputs the current signal, a second transconductance amplifier which has an output thereof connected to the output of the first transconductance amplifier, inputs a voltage generated by both outputs and a second bias voltage therein, converts a difference signal into a current signal, and outputs the current signal, a first output transistor which has a gate thereof connected to an output of the second transconductance amplifier and a source thereof connected to a first power source, a second output transistor which has polarity opposite to polarity of the first output transistor, has a gate thereof connected to an output of the differential amplifier, has a source thereof connected to a second power source, and has a drain thereof connected to a drain of the first output transistor thus constituting a push-pull output, and a phase compensation element which is connected between the output of the differential amplifier and a node between the drains of the first and the second output transistors.

With such an amplifier circuit, it is possible to provide an amplifier circuit having a simple circuit architecture and that includes a push-pull output as an operational principle. Further, by adopting the push-pull output architecture, it is possible to suppress a bias current of the push-pull output stage at the time of still operation with no signals and to allow the flow of a large current at the time of a heavy load whereby the power consumption can be reduced.

BRIEF DESCRIPTION OF THE DRAWINGS

With the above as background, reference will now be made to the following detailed description of the preferred embodiments of the invention and the accompanying drawings, wherein.

DETAILED DESCRIPTION OF THE PREFERRED EMBODIMENTS

Figure 1:
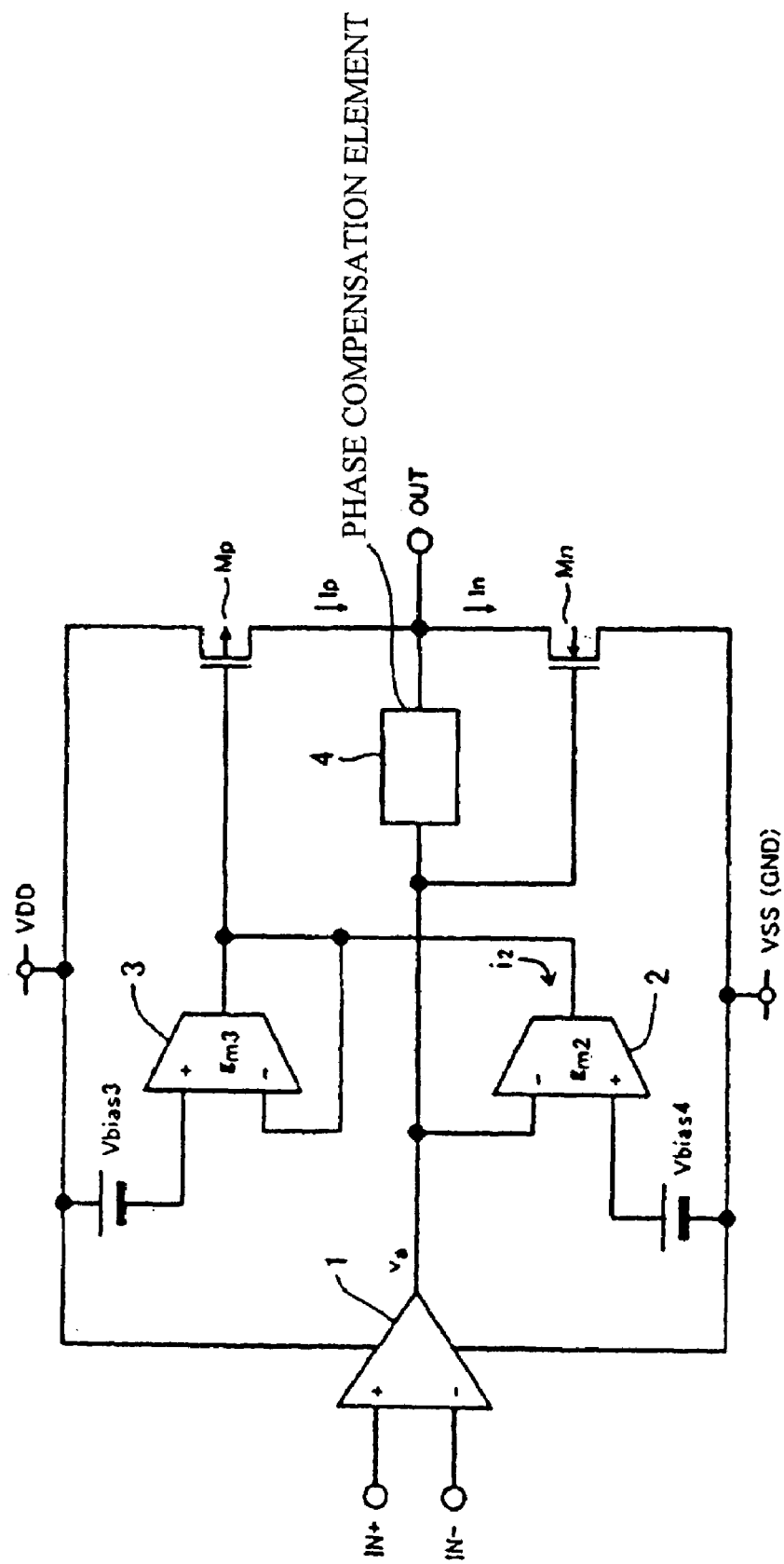
FIG. 1 is a circuit diagram showing the basic architecture of an amplifier circuit according to the present invention.

FIG. 1 is a circuit diagram showing the basic architecture of an amplifier circuit according to the present invention. The amplifier circuit includes a differential amplifier 1 in a first amplifying stage, a first transconductance amplifier 2 and a second transconductance amplifier 3 in a second amplifying stage, and a first output transistor Mp and a second output transistor Mn which form the push-pull outputs having polarities opposite from each other and use the push-pull outputs as an output OUT of this amplifier circuit in an output stage. Further, a phase compensation element 4 is provided between the output of the differential amplifier 1 and the output OUT of the amplifying circuit.

The differential amplifier 1 includes an inverted input IN−, a non-inverted input IN+ and an output and a difference signal between signals inputted to the inverted input IN− and the non-inverted input IN+ is amplified and then is outputted from the output.

The first transconductance amplifier 2 has inputs to which an output of the differential amplifier 1 and a first bias voltage Vbias4 are connected, converts a difference signal between an output voltage of the differential amplifier 1 and the first bias voltage Vbias4 into a current signal and outputs the current signal. The second transconductance amplifier 3 has an input to which this output and the output of the first transconductance amplifier 2 are connected and an input which is connected to a second bias voltage Vbias3, and converts a difference signal between a voltage generated by both of the outputs of the first transconductance amplifier 2 and the second transconductance amplifier 3 and the second bias voltage Vbias3 into a current signal and outputs the current signal.

The first output transistor Mp of the output stage has a gate thereof connected to the output of the second transconductance amplifier 3, a source thereof connected to a first power source VDD and a drain thereof connected to an output OUT of this amplifier circuit. The second output transistor Mn has a gate thereof connected to the output of the differential amplifier 1, a source thereof connected to a second power source VSS and a drain thereof connected to the output OUT of this amplifier circuit. The first output transistor Mp and the second output transistor Mn have drains thereof connected to each other thus constituting a push-pull output.

Next, the manner of operation of the amplifier circuit having the above-mentioned constitution in a small signal model is explained. The difference signal between the inverted input signal and the non-inverted signal is amplified by the differential amplifier 1 in the first stage. The output signal of the differential amplifier 1 which is a signal obtained by amplifying the difference signal is received by the input of the first transconductance amplifier 2 and the gate of the second output transistor Mn.

The first transconductance amplifier 2 converts the difference signal between the output signal of the difference amplifier 1 and the first bias voltage Vbias4 into a current signal on which a bias current is superposed and outputs the current signal. Assuming the output signal voltage of the differential amplifier 1 as $v_a$ and the transconductance of the first transconductance amplifier 2 as $g_{m2}$, the current output signal $i_2$ of the first transconductance amplifier 2 is expressed by a following formula.

$$i_2 = g_{m2} \times v_a \qquad (1)$$

Since the first bias voltage Vbias4 can be converted into the current signal with small distortion by setting the first bias voltage Vbias4 equal to the bias voltage (operation point) of the output of the differential amplifier 1, these voltages are set to the same value in this embodiment. The output of the first transconductance amplifier 2 is connected to the output of the second transconductance amplifier 3 and, further, is connected to the gate of the first output transistor Mp and hence, the current signal voltage $i_2$ of the first transconductance amplifier 2 is converted into a voltage signal due to parallel output resistances of the first transconductance amplifier 2 and the second transconductance amplifier 3 and the voltage signal is transmitted as a gate signal of the first output transistor Mp. Assuming an output resistance in the small signal model in the whole circuit constituted by combining the first and second transconductance amplifiers 2, 3 as $r_{o23}$, the gate signal voltage $V_{gp}$ of the first output transistor Mp is expressed by a following formula.

$$V_{gp} = r_{o23} \times i_a = g_{m2} \times r_{o23} \times v_a \qquad (2)$$

From this formula, the gate signal of the first output transistor Mp and the gate signal of the second output transistor Mn assume the same phase. Accordingly, the first transconductance amplifiers 2 has a function of transmitting the output signal of the differential amplifier 1 to the gate of the first output transistor Mp as the input signal.

Further, the second transconductance amplifier 3 allows inputting of the second bias voltage Vbias3 and the output of the second transconductance amplifier 3 per se and hence, at the time of still operation in which there is no inputting of signal to the differential amplifier 1, that is, when impedance connected to the second transconductance amplifier 3 is simple or in a small signal model, it is possible to consider that the output of the second transconductance amplifier 3 is in a virtually short-circuited stage with the second bias voltage Vbias3. Accordingly, the output voltage of the second transconductance amplifier 3 becomes equal to the second bias voltage Vbias3.

Further, the output of the second transconductance amplifier 3 is connected to the gate of the first output transistor Mp and hence, the gate voltage of the first output transistor Mp is biased by the second bias voltage Vbias3 in terms of DC.

Accordingly, assuming a gate/source voltage of the first output transistor Mp as $V_{GSP}$, a following relationship is established.

$$|V_{GSP}| = V\text{bias3} \quad (3)$$

Accordingly, the second transconductance amplifier 3 has a function of holding the gate of the first output transistor Mp at the bias voltage Vbias3 in terms of DC. That is, the operation point of the first output transistor Mp can be set based on the bias voltage Vbias3 independently from the second output transistor Mn.

The bias currents of the first and second output transistors Mp, Mn, which constitute the output stages when the amplifier circuit is in the still operation are studied. The gate of the first output transistor Mp is biased with the second bias voltage Vbias3 so as to flow the drain current Ip determined by the gate voltage. On the other hand, the gate of the second output transistor Mn is biased with the output operation point voltage of the differential amplifier 1 so as to flow the drain current In determined by the gate voltage. Then, the current having a smaller current value out of the currents Ip, In which are made to flow by the first and second output transistor Mp, Mn constitutes the bias current of the output stage. Here, to take the generated offset voltage into consideration, it is desirable that the currents which are made to flow by the respective first and second output transistors Mp, Mn are set to Ip=In.

Finally, a case on a large signal model in which the signal is inputted to the input of the differential amplifier 1 and the output voltage is changed is studied. When the output voltage $v_a$ of the differential amplifier 1 is changed close to the first power source VDD, the gate voltages of the first and second output transistors Mp, Mn are changed close to the first power source VDD compared to the bias voltages at the time of still operation. Then, the voltage between the gate and the source of the first output transistor Mp is decreased and hence, the drain current Ip which is made to flow is decreased. On the other hand, the voltage between the gate and the source of the second output transistor Mn is increased and hence, the drain current In which is made to flow is increased. When the output includes the resistance load, the drain current In which is made to flow by the second output transistor Mn is increased and hence, the output of the amplifier circuit performs the operation to lead in the current.

On the other hand, when the output voltage $v_a$ of the differential amplifier 1 is changed close to the second power source VSS, the gate voltages of the first and second output transistors Mp, Mn are changed close to the second power source VSS compared to the bias voltages at the time of still operation. Then, the voltage between the gate and the source of the first output transistor Mp is increased and hence, the drain current Ip which is made to flow is increased. On the other hand, the voltage between the gate and the source of the second output transistor Mn is decreased and hence, the drain current In which is made to flow is decreased. When the output includes the resistance load, the drain current Ip, which is made to flow by the first output transistor Mp, is increased and hence, the output of the amplifier circuit performs the operation to discharge the current. In this manner, the output stage of the amplifier circuit can perform the push-pull output operation.

Figure 2:
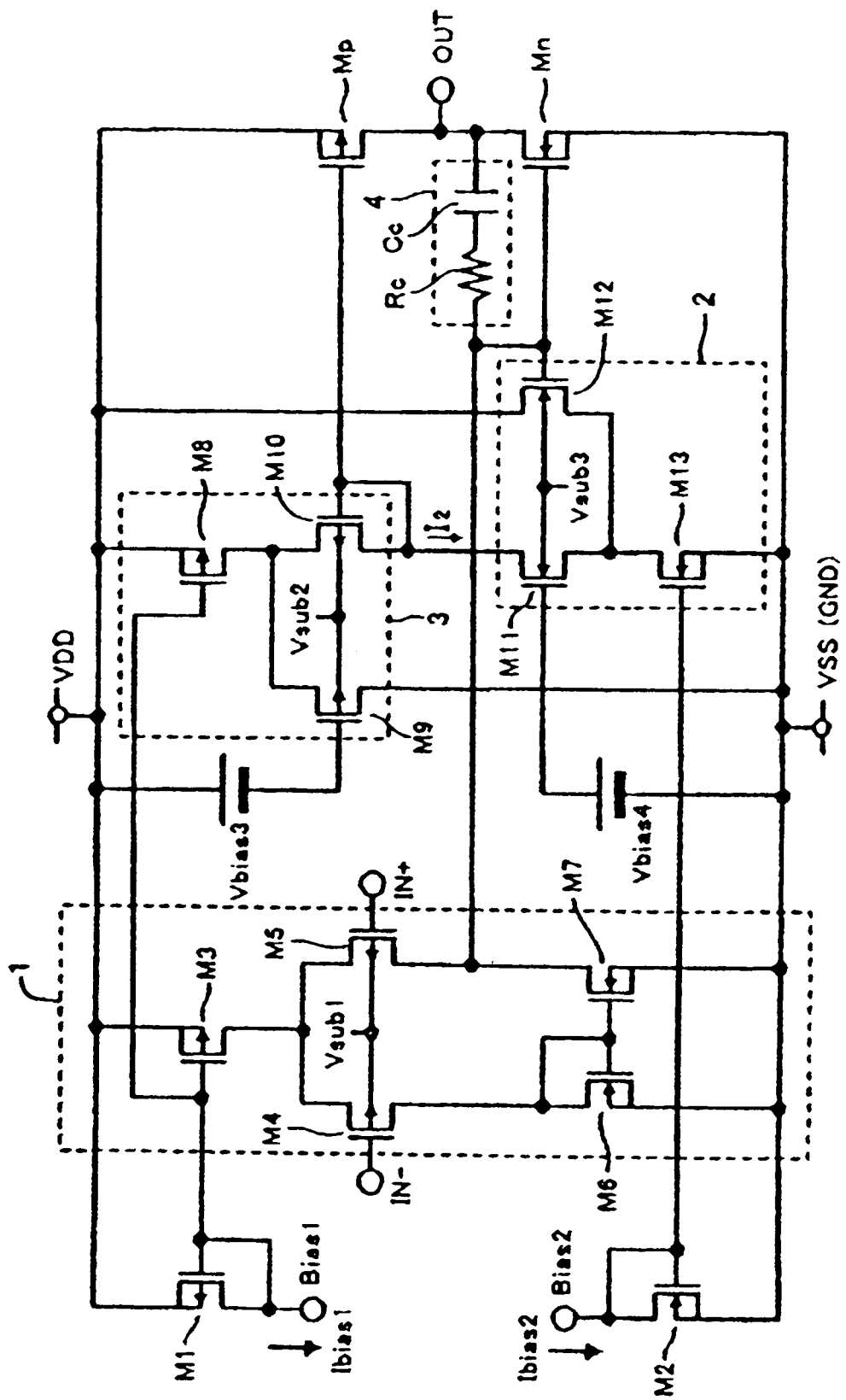
FIG. 2 is a circuit diagram illustrating the amplifier circuit according to the present invention using MOS transistors.

FIG. 2 is a circuit diagram illustrating the amplifier circuit according to the present invention using MOS transistors. In FIG. 2, elements which are identical with the elements indicated in FIG. 1 are indicated by same symbols.

The differential amplifier 1 in the first stage includes a PMOS transistor M4 which has a gate thereof connected to the inverted input IN− and a PMOS transistor M5 which has a gate thereof connected to the non-inverted input IN+ and their back gates are connected to each other and are connected to a power source Vsub1. Drains of the PMOS transistors M4, M5 are respectively connected to drains of NMOS transistors M6, M7. Out of these NMOS transistors M6, M7, a gate of one NMOS transistor M6 is connected to the drain of the NMOS transistor M6 per se and a gate of another NMOS transistor M7, while sources of these NMOS transistors M6, M7 are connected to a second power source VSS. Further, sources of the PMOS transistors M4, M5 are connected to each other and are connected to a drain of a PMOS transistor M3 while a source of the PMOS transistor M3 is connected to a first power source VDD. A gate of the PMOS transistor M3 is connected to a gate and a drain of a PMOS transistor M1 and a source of the PMOS transistor M3 is connected to the first power source VDD, and a bias Bias1 is applied to a drain of the PMOS transistor M3.

In this manner, in the differential amplifier 1 of the initial stage, the PMOS transistors M4, M5 constitute the inverted and non-inverted differential inputs, the PMOS transistor M3 constitutes a current mirror circuit together with the PMOS transistor M1 thus forming a constant current source which flows a constant current Ibias1 to the differential inputs, while the NMOS transistors M6, M7 constitute a current mirror load circuit for the differential inputs.

The first transconductance amplifier 2 in the second amplifying stage includes an NMOS transistor M11 having a gate thereof to which a bias voltage Vbias4 is applied and an NMOS transistor M12 having a gate thereof which is connected to the drain of the PMOS transistor M5 which constitutes an output of the differential amplifier 1 and a drain thereof connected to the first power source VDD, wherein back gates of these transistors are connected to each other and are connected to a power source Vsub3. Sources of NMOS transistors M11, M12 are connected to each other and, at the same time, are connected to a drain of an NMOS transistor M13, while a source of the NMOS transistor M13 is connected to a second power source VSS. A gate of the NMOS transistor M13 is connected to a gate and a drain of the NMOS transistor M2 and a source of the NMOS transistor M13 is connected to the second power source VSS, and a bias Bias2 is applied to a drain of the NMOS transistor M13.

Accordingly, the first transconductance amplifier 2 is a portion which uses the gates of the NMOS transistors M11, M12 as inputs and constitutes a circuit which applies the bias voltage Vbias4 to the gate of one NMOS transistor M11, inputs an output of the differential amplifier 1 to the gate of another NMOS transistor M12 and outputs the drain of the NMOS transistor M11. The NMOS transistor M13 constitutes a current mirror circuit together with the NMOS transistor M2 and also functions as a constant current source which flows a constant current Ibias2 to the NMOS transistors M11, M12.

Further, the second transconductance amplifier 3 includes an PMOS transistor M9 having a gate to which a bias voltage Vbias3 is applied and a PMOS transistor M10 having a gate and a drain which are connected to the drain of the NMOS transistor M11 which constitutes an output of the first transconductance amplifier 2, wherein back gates of these transistors are connected to each other and are connected to a power source Vsub2. Sources of the PMOS transistors M9, M10 are connected to each other and, at the same time, are connected to a drain of a PMOS transistor M8, while the source of the PMOS transistor M8 is connected to a first power source VDD. A gate of the PMOS transistor M8 is connected to a gate and a drain of the PMOS transistor M1.

Accordingly, the second transconductance amplifier 3 is a portion which uses the PMOS transistor M8 as a constant current source and the gates of the PMOS transistors M9, M10 as inputs and is configured to apply a bias voltage Vbias3 to a gate of one PMOS transistor M9 and connects a gate and a drain of another PMOS transistor M10 to form an output. The output of the first transconductance amplifier 2 and the output of the second transconductance amplifier 3 are connected to each other.

The output stage is constituted of the PMOS transistor Mp and the NMOS transistor Mn, wherein a gate of the PMOS transistor Mp is connected to a drain of the PMOS transistor M10 which constitutes an output of the second transconductance amplifier 3, a gate of the NMOS transistor Mn is connected to the output of the differential amplifier 1, and the node of the drains of the PMOS transistor Mp and the NMOS transistor Mn constitute the output of this amplifier circuit.

The phase compensation element 4 is constituted of a resistance Rc and a capacitor Cc which are connected in series between the output of the differential amplifier 1 and the output terminal OUT which constitutes the output of the amplifier circuit.

In this amplifier circuit, it is assumed that the output of the second transconductance amplifier 3 is in a virtually short-circuited state with the second bias voltage Vbias3. As a result, an operation point of the first output MOS transistor Mp can be set independently from the second output MOS transistor Mn due to the bias voltage Vbias3. This constitution is explained in detail.

A sucking current $I_2$ to the NMOS transistor M11 is determined based on the bias voltage Vbias4 inputted to the NMOS transistors M11, M12 of the first transconductance amplifier 2 and the operation point of the output of the differential amplifier 1. In the second transconductance amplifier 3, a constant current value determined based on the PMOS transistor M8 is set twice as large as the current $I_2$. Circuit parameters (sizes of respective transistors and the like) are adjusted such that the current which flows in the PMOS transistor M9 becomes equal to the current $I_2$. Due to such a construction, the current which the PMOS transistor M10 discharges is equal to the current $I_2$ which is sucked in by the NMOS transistor M11 and the state of the PMOS transistor M10 becomes equal to the state of the PMOS transistor M9 and hence, the gate voltages of these transistors also become equal. Since the gate of the PMOS transistor M10 is connected to the drain of the PMOS transistor M10 per se and hence, the voltage of the drain of the PMOS transistor M10 becomes equal to the second bias voltage Vbias3. Accordingly, the operation point of the first output MOS transistor Mp is determined based on the bias voltage Vbias3.

Figure 3:
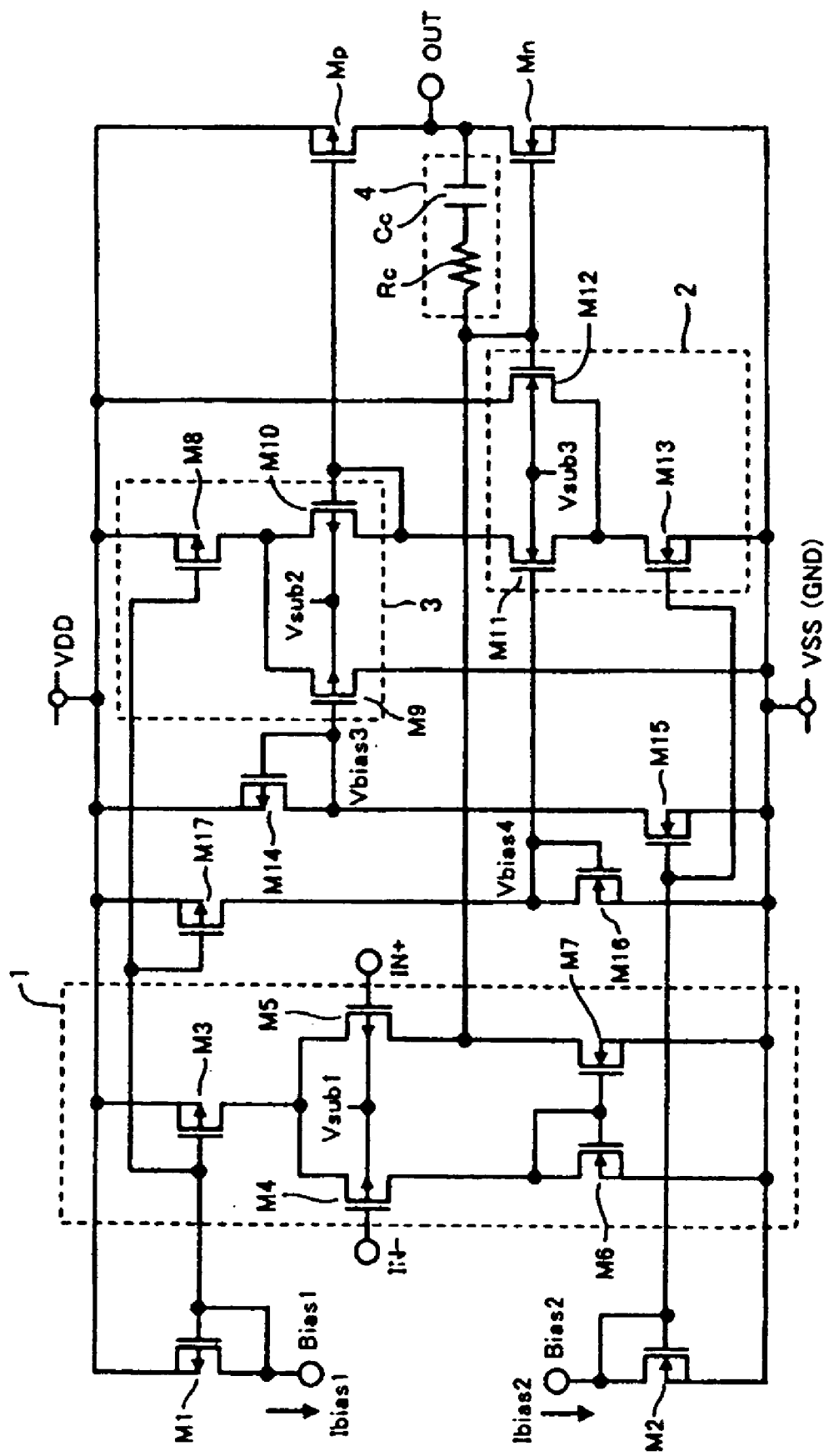
FIG. 3 is a circuit diagram illustrating a bias voltage source in FIG. 2 using MOS transistors.

FIG. 3 is a circuit diagram illustrating the bias voltage source shown in FIG. 2 using MOS transistors. Here, in FIG. 3, elements which are identical with the elements shown in FIG. 2 are indicated by the same symbols and their detailed explanation is omitted.

The voltage source of the bias voltage Vbias3 is constituted of a PMOS transistor M14 and an NMOS transistor M15. The NMOS transistor M15 has a source thereof connected to a second power source VSS and a gate thereof connected to a gate of an NMOS transistor M2 which constitutes a current mirror circuit thus forming a constant current source. The PMOS transistor M14 has a source thereof connected to the first power source VDD and a gate and a drain thereof connected to a drain of an NMOS transistor M15 in a short-circuited manner. Due to such a constitution, the bias voltage source can output a gate-source voltage which is generated by making a constant current from the NMOS transistor M15 to the PMOS transistor M14 which have the gate and the drain thereof short-circuited to each other as the bias voltage Vbias3.

The voltage source of another bias voltage Vbias4 is constituted of a NMOS transistor M16 and PMOS transistor M17. The PMOS transistor M17 has a source thereof connected to the first power source VDD and a gate thereof connected to a gate of the PMOS transistor M1 which constitutes a current mirror circuit thus forming a constant current source. The NMOS transistor M16 has a source thereof connected to a second power source VSS and a gate and a drain thereof connected to a drain of a PMOS transistor M17 in a short-circuited manner. Due to such a constitution, the bias voltage source can output a gate-source voltage which is generated by making a constant current from the PMOS transistor M17 flow to the NMOS transistor M16 which has the gate and the drain thereof short-circuited to each other as the bias voltage Vbias4.

Here, with respect to the circuit architecture shown in FIG. 3, the method for determining the bias currents of the PMOS transistor Mp and the NMOS transistor Mn which constitute the output stage when the amplifier circuit performs the still operation is described.

The gate voltage of the PMOS transistor Mp at the time of the still operation becomes equal to the bias voltage Vbias3 and hence, the gate-source voltage Vgsp of the PMOS transistor Mp becomes equal to the gate-source voltage Vgs14 which is generated in the PMOS transistor M14. This gate-source voltage Vgs14 is determined based on the constant current value of the NMOS transistor 15 and the transistor size of the PMOS transistor M14 and hence, the bias current value of the PMOS transistor Mp can be obtained by setting the size of the PMOS transistor Mp. In short, this method is equal to a method in which an output current value with respect to an input current value is obtained based on the size ratio of transistors in a current mirror circuit.

On the other hand, while the gate voltage of the NMOS transistor Mn becomes the operation point voltage of the output of the differential amplifier 1, this operation point voltage becomes equal to the drain voltages of the NMOS transistors M6, M7 which constitute a current mirror load circuit of the differential amplifier. That is, the gate-source voltage Vgsn of the NMOS transistor Mn becomes equal to the gate-source voltage Vgs6 of the NMOS transistor M6. Since the gate-source voltage Vgs6 is determined based on the bias current and the transistor size of the NMOS transistor M6, by setting the transistor size of the NMOS transistor Mn, the bias current of the NMOS transistor Mn is determined based on the size ratio of the NMOS transistor M6. Here, it is desirable to set the bias voltage Vbias4 equal to the operation point voltage of the output of the differential amplifier 1 and hence, by setting the constant current value of the PMOS transistor M17, the transistor size of the NMOS transistor M16 can be determined based on the transistor size ratio. Accordingly, the NMOS transistors M6, M7, M16, Mn assume the relationship of transistor size ratio based on the bias (drain) current ratio.

Figure 4:
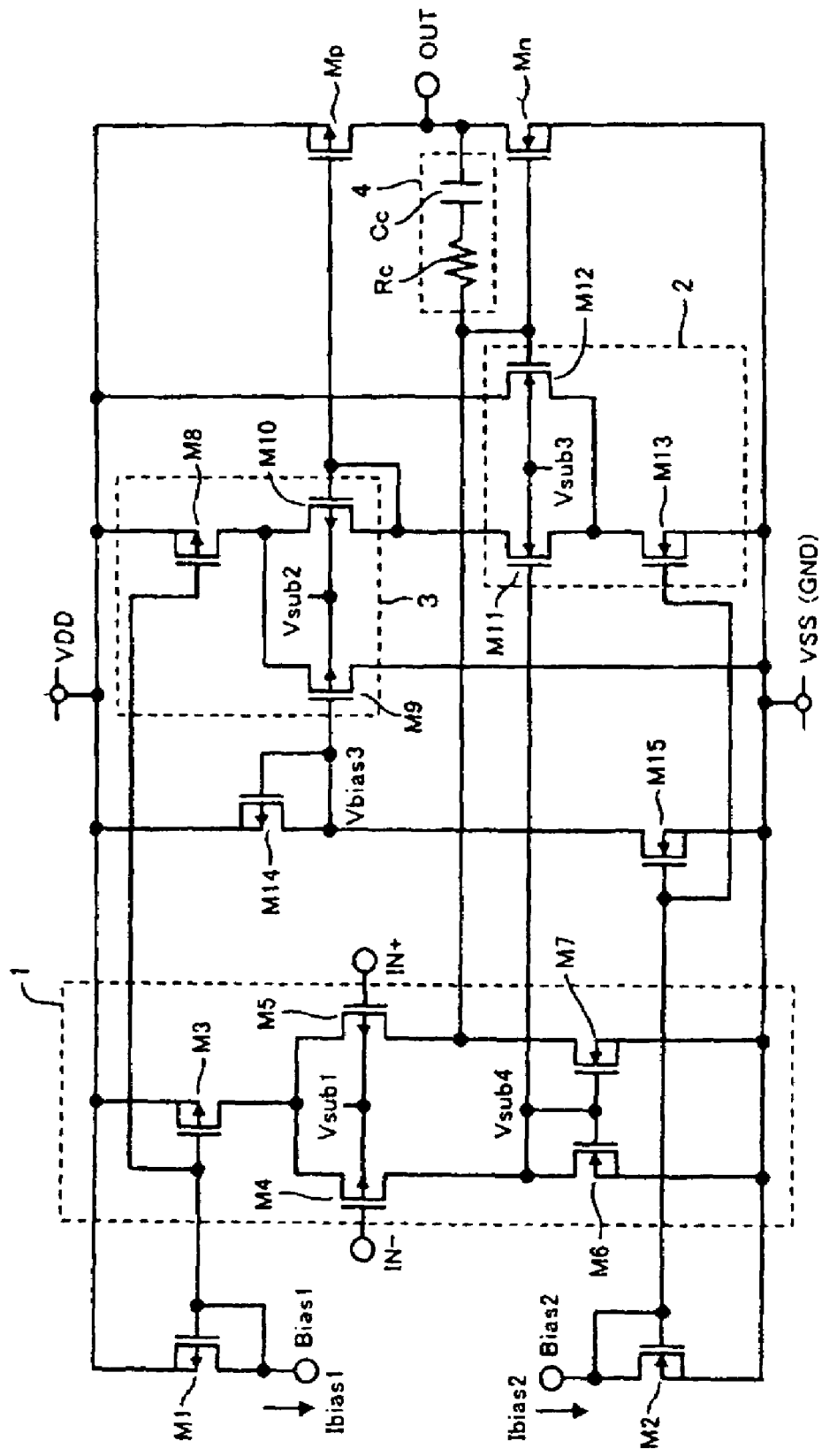
FIG. 4 is another circuit diagram illustrating a bias voltage source in FIG. 2 using MOS transistors.

FIG. 4 is another circuit diagram illustrating the bias voltage source shown in FIG. 2 using MOS transistors. Here, in FIG. 4, elements which are identical with the elements shown in FIG. 2 are indicated by same symbols and their detailed explanation is omitted.

According to this bias voltage source, the NMOS transistor M6 of the current mirror load circuit in the differential amplifier 1 is used as the bias voltage source of the first transconductance amplifier 2, while the gate-drain voltage Vgs6 of the NMOS transistor M6 of the current mirror load circuit is used as the bias voltage Vbias4.

Further, the bias voltage source of the second transconductance amplifier 3 is, in the same manner as the circuit example shown in FIG. 3, constituted of the PMOS transistor M14 and the NMOS transistor M15.

Due to such a architecture, compared to the amplifier circuit shown in FIG. 3, one bias current path in the circuit of the amplifier circuit can be eliminated thus decreasing the current consumption.

Figure 5:
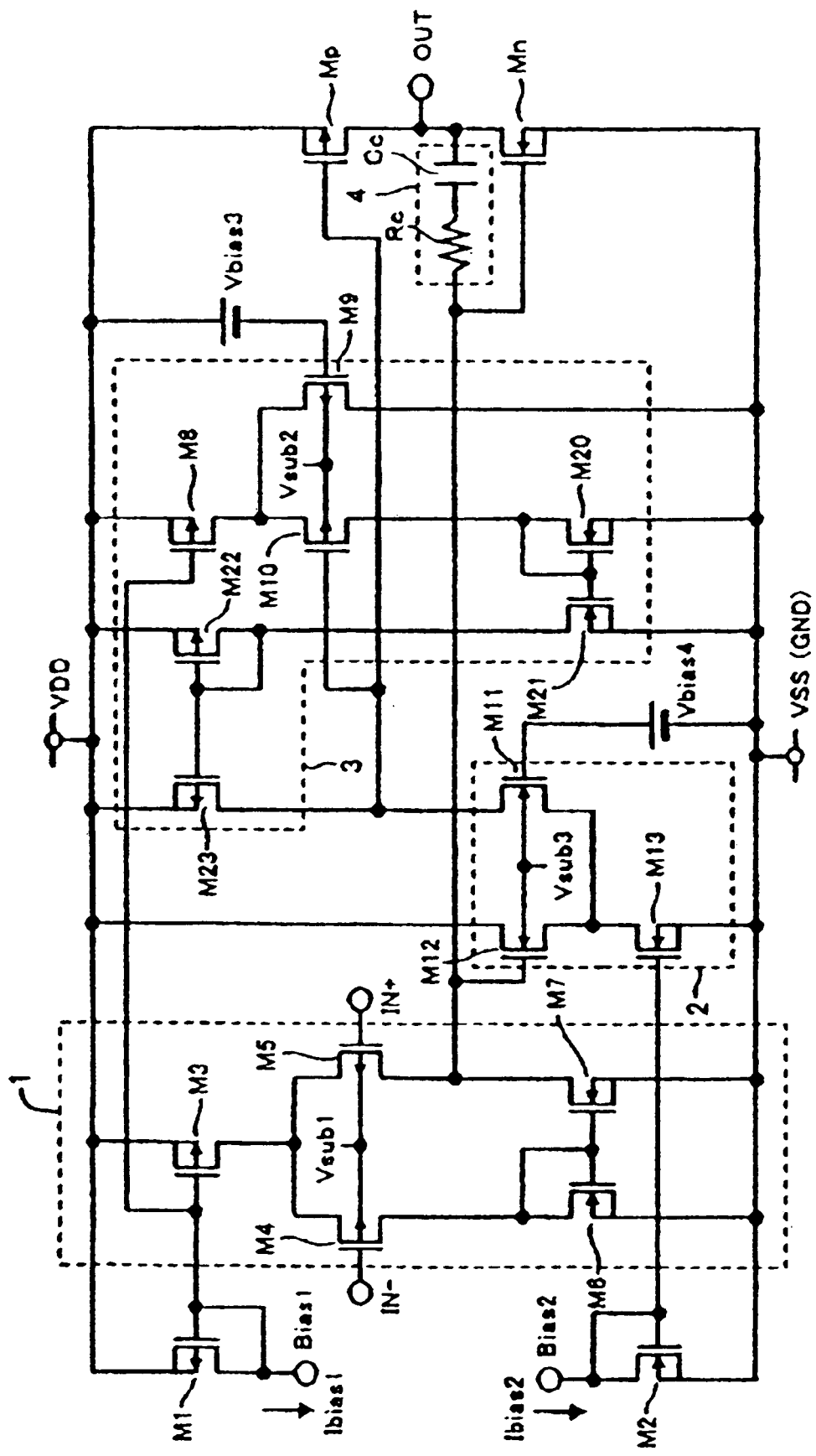
FIG. 5 is a circuit diagram illustrating the basic architecture of the amplifier circuit according to the present invention shown in FIG. 1 using MOS transistors.

FIG. 5 is a circuit diagram of another embodiment which embodies the basic architecture of the amplifier circuit according to the present invention shown in FIG. 1 using MOS transistors. Here, in FIG. 5, elements which are identical with the elements shown in FIG. 2 are indicated by the same symbols and their detailed explanation is omitted.

In this amplifier circuit, the differential amplifier 1, the first transconductance amplifier 2, the PMOS transistor Mp and NMOS transistor Mn of the output stage, and the phase compensating element 4 have the same circuit constitution as the circuit described in the amplifier circuit shown in FIG. 2.

The second transconductance amplifier 3 includes a PMOS transistor M9 having a gate to which a bias voltage Vbias3 is applied and a PMOS transistor M10 having a gate thereof connected to a drain of an NMOS transistor M1 which is an output of a first transconductance amplifier 2, wherein back gates of these transistors are connected to each other and are connected to a power source Vsub2. Sources of the PMOS transistors M9, M10 are connected to each other and, at the same time, are connected to a drain of a PMOS transistor M8 and a source of the PMOS transistor M8 is connected to a first power source VDD. A gate of the PMOS transistor M8 is connected to a gate and a drain of a PMOS transistor M1. A drain of the PMOS transistor M9 is connected to a second power source VSS, while a drain of the PMOS transistor M10 is connected to a gate and a drain of an NMOS transistor M20. The NMOS transistor M20 has a source thereof connected to the second power source VSS and a gate thereof connected to a gate of the NMOS transistor M21. The NMOS transistor M21 has a source thereof connected to the second power source VSS and a drain thereof connected to a gate and a drain of the PMOS transistor M22. The PMOS transistor M22 has a source thereof connected to the first power source VDD and a gate thereof connected to a gate of the PMOS transistor M23. The PMOS transistor M23 has a source thereof connected to the first power source VDD and a drain thereof connected to a drain of the NMOS transistor M11 which constitutes an output of the first transconductance amplifier 2.

Accordingly, the second transconductance amplifier 3 uses the PMOS transistor M8 as the constant current source, uses the gates of the PMOS transistors M9, M10 as inputs, connects the drain of the PMOS transistor M10 to a portion of a current mirror circuit constituted of the NMOS transistors M20, M21 to which the gate and the drain of the NMOS transistor M20 of the current mirror circuit is connected and returns the current signal from the PMOS transistor M10. Further, the second transconductance amplifier 3 connects the drain of the NMOS transistor M21 to a portion of a current mirror circuit constituted of the PMOS transistors M22, M23 to which the gate and the drain of the PMOS transistor M22 of the current mirror circuit are connected and returns the current signal from the PMOS transistor M20. Further, the drain of the PMOS transistor M23 is constituted as the output of the transconductance amplifier 3, and this output and the drain of the NMOS transistor M11 which constitutes the output of the first transconductance amplifier 2 are connected to the gate of the PMOS transistor Mp of the output stage.

In the amplifier circuit shown in FIG. 5, the number of transistors which are connected longitudinally between the power sources (between VDD and VSS) is three. On the other hand, in the amplifier circuit shown in FIG. 2 to FIG. 4, the number of transistors which are connected longitudinally between the power sources is four. Compared to the amplifying circuits shown in FIG. 2 to FIG. 4, the amplifier circuit shown in FIG. 5 is configured to reduce the power source voltage (to be accurate, the voltage between power sources).

Here, with respect to the amplifier circuits shown in FIG. 4 and FIG. 5, the bias current of the PMOS transistor Mp and the NMOS transistor Mn of the output stage can be determined by the same manner as the amplifier circuit shown in FIG. 2.

Although the preferred embodiments of the present invention have been explained heretofore, the present invention is not limited to these specific embodiments. For example, with respect to the specific circuit architectures of the above-mentioned embodiments, it is possible to practice the circuit constitution in which the polarities of all transistors are inverted such that the NMOS transistors are converted into the PMOS transistors and the PMOS transistors are converted into the NMOS transistors and the power source VDD and the power source VSS are exchanged from each other. Further, it is also possible to realize the circuit constitution by using active elements such as bipolar transistors which have the same characteristics as the MOS transistors.

As has been explained heretofore, according to the present invention, there is provided the first transconductance amplifier to which the output of the two-input differential amplifier and the first bias voltage are inputted. The output of the first transconductance amplifier is connected to another input and the output of the second transconductance amplifier and the gate of the first output transistor. The second bias voltage is used as another input of the second transconductance amplifier. The output of the differential amplifier is connected to the gate of the second output transistor which has the polarity opposite to the polarity of the first output transistor. The drains of the first and the second output transistors are connected to each other thus constituting the push-pull output. Due to such a architecture, it is possible to provide the amplifier circuit of push-pull output which has the simple circuit constitution and the operation principle. By adopting the push-pull output constitution, the bias current of the push-pull output stage can be suppressed to the low value at the time of still operation with no signal and the large current can be made to flow at the time of heavy load whereby it is possible to enhance the reduction of power consumption of the amplifier circuit.

Further, as the gate voltages of the first and second output transistors of the push-pull output stage, it is possible to use the voltage determined by the drain current and the transistor size of the transistor in the bias voltage source, wherein the bias current of the push-pull output stage can be determined based on the same principle as the current mirror circuit based on the transistor size ratio of the transistors of the voltage sources whereby it is possible to provide the amplifier circuit which can obtain the stable output against influences such as manufacturing irregularities, temperature change and the like.

Further, the operation points of the first and second output transistors of the push-pull output stage can be independently set and hence, the inputs to the gates of the first and second output transistors can have the same phase. Accordingly, the operation can be performed in the current mode due to the transconductance amplifier and hence, the operation speed can be enhanced.

Figure 6:
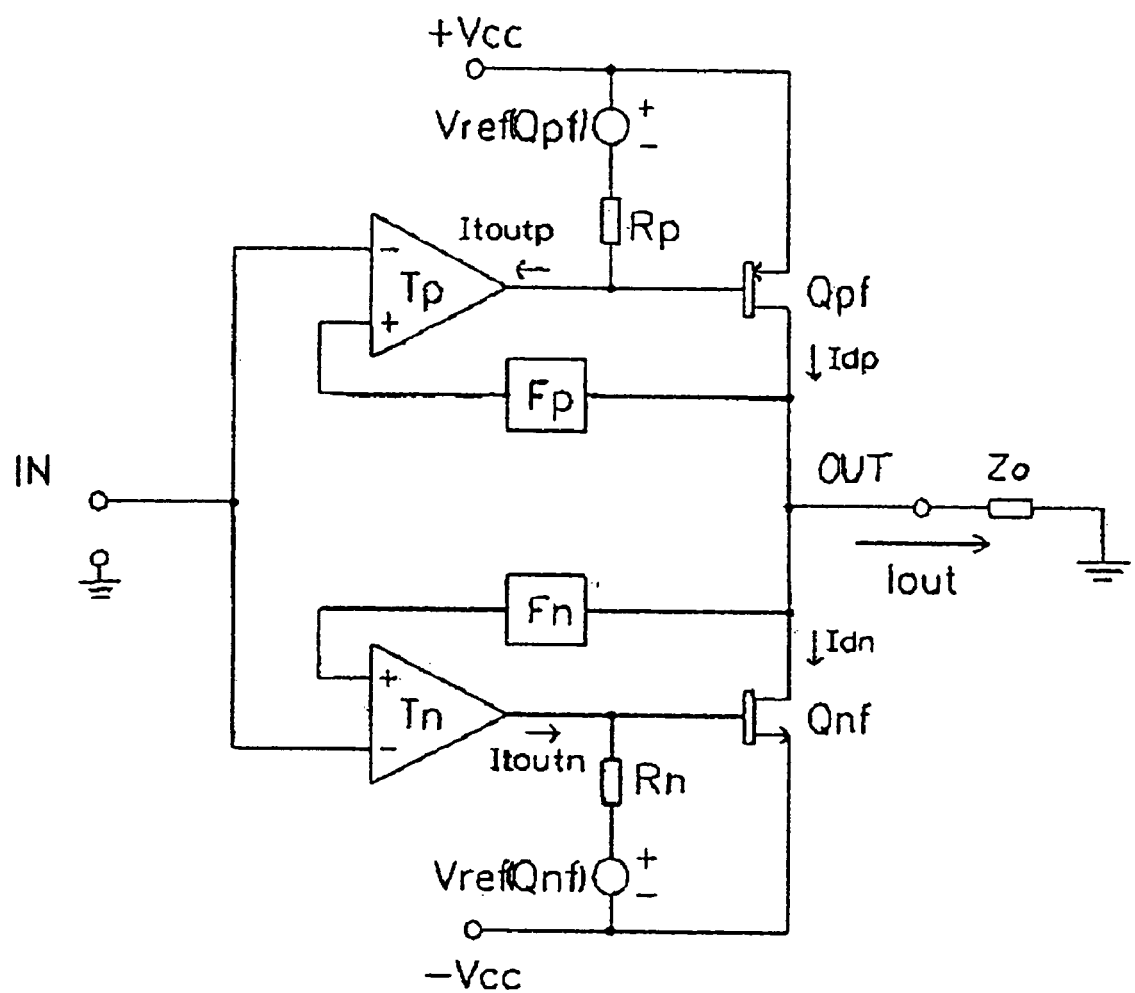
FIG. 6 illustrates a conventional amplifier structure.
Figure 7:
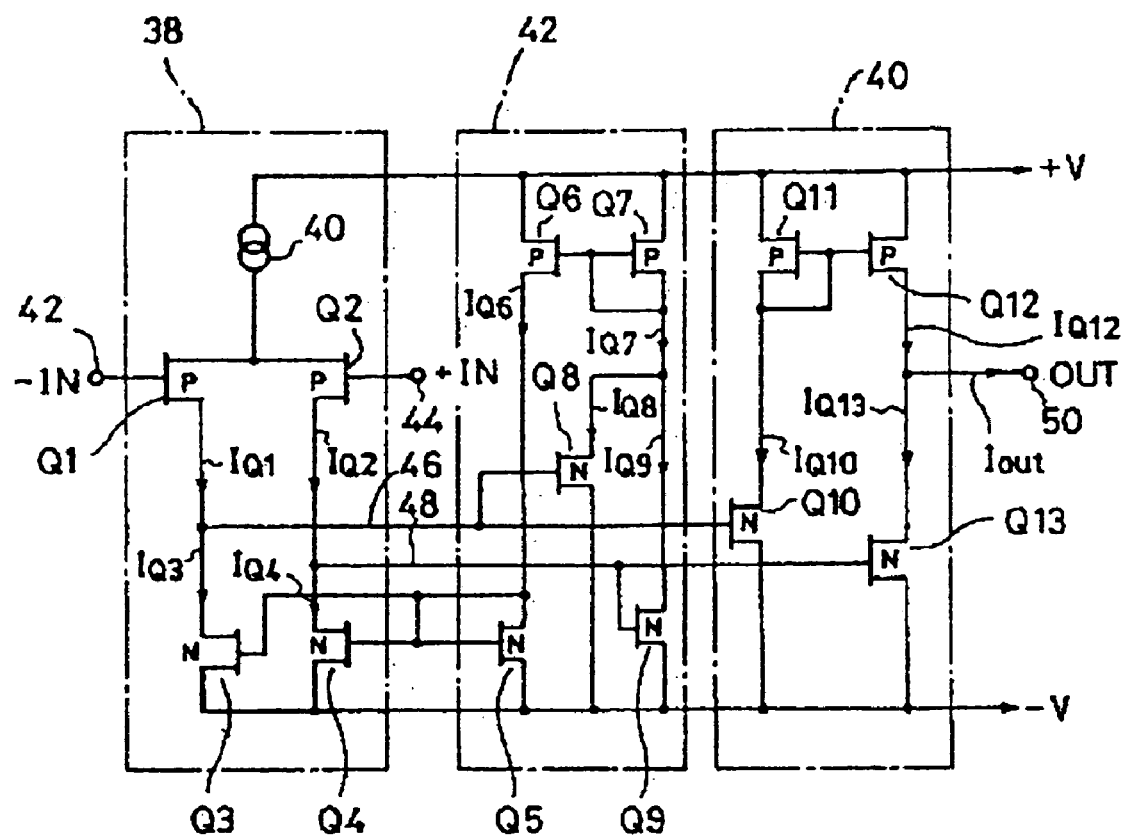
FIG. 7 illustrates a conventional amplifier structure.

Here, the amplifier circuit according to the present invention has no feedback from the output and hence is superior to the conventional amplifier illustrated in FIG. 6 with respect to stability and frequency characteristics. The amplifier according to the present invention can control the output transistors without using the current mirror and hence, the output currents of the output transistors are not limited to the bias circuit in the current mirror circuit compared to the amplifier illustrated in FIG. 7.

What is claimed is:

1. An amplifier circuit having a differential amplifier which amplifies a difference signal between an inverted signal and a non-inverted signal comprising:
    a first transconductance amplifier which inputs an output of the differential amplifier and a first bias voltage therein, converts a difference signal between the output of the differential amplifier and the first bias voltage into a current signal and outputs the current signal;
    a second transconductance amplifier which has an output thereof connected to the output of the first transconductance amplifier, inputs a voltage generated by both outputs and a second bias voltage therein, converts a difference signal between the voltage generated by both outputs and the second bias voltage into a current signal, and outputs the current signal;
    a first output transistor which has a gate thereof connected to the output of the second transconductance amplifier and a source thereof connected to a first power source;
    a second output transistor which has polarity opposite to polarity of the first output transistor, has a gate thereof connected to the output of the differential amplifier, has a source thereof connected to a second power source, and has a drain thereof connected to a drain of the first output transistor thus constituting a push-pull output; and
    a phase compensation element which is connected between the output of the differential amplifier and a node between the drains of the first and the second output transistors.

2. An amplifier circuit according to claim 1, wherein the first transconductance amplifier includes a first NMOS transistor which has a source thereof connected to the second power source and functions as a constant current source, a second NMOS transistor which has a source thereof connected to the drain of the first NMOS transistor, uses a gate thereof as an input for the first bias voltage, and uses a drain thereof as an output of the first transconductance amplifier, and a third NMOS transistor which has a source thereof connected to a drain of the first NMOS transistor, uses a gate thereof as an input for an output of the differential amplifier, and has a drain thereof connected to the first power source;
    wherein the second transconductance amplifier includes a first PMOS transistor which has a source thereof connected to the first power source and functions as a constant current source, a second PMOS transistor which has a source thereof connected to the drain of the first PMOS transistor, uses a gate thereof as an input for the second bias voltage, and has a drain thereof connected to the second power source, and a third PMOS transistor which has a source thereof connected to a drain of the first PMOS transistor, and connects both of a gate and a drain thereof to a drain of the second NMOS transistor which is an output of the first transconductance amplifier; and
    wherein the first output transistor is constituted of a PMOS transistor and the second output transistor is constituted of an NMOS transistor.

3. An amplifier circuit according to claim 2, wherein a voltage source of the first bias voltage includes a fourth PMOS transistor which has a source thereof connected to the first power source and functions as a constant current source, and a fourth NMOS transistor which has a source thereof connected to the second power source, and has both of a gate and a drain thereof connected to a drain of the fourth PMOS transistor and outputs a voltage generated between the gate and the source thereof due to a drain current of the fourth PMOS transistor as the first bias voltage; and
    wherein a voltage source of the second bias voltage includes a fifth NMOS transistor which has a source thereof connected to the second power source and functions as a constant current source, and a fifth PMOS transistor which has a source thereof connected to the first power source, and has both of a gate and a drain thereof connected to a drain of the fifth NMOS transistor and outputs a voltage generated between the gate and the source thereof due to a drain current of the fifth NMOS transistor as the second bias voltage.

4. An amplifier circuit according to claim 2, wherein the differential amplifier includes a current mirror load circuit which is constituted of NMOS transistors having respective sources thereof connected to the second power source;
    wherein a voltage source of the first bias voltage uses a drain voltage of the NMOS transistor which connects a gate and a drain of the current mirror load circuit as the first bias voltage, a voltage source of the second bias voltage includes the fifth NMOS transistor which has a source thereof connected to the second power source and functions as a constant current source and a fifth PMOS transistor which has a source thereof connected to the first power source, and has both of a gate and a drain thereof connected to a drain of the fifth NMOS transistor and outputs a voltage generated between the gate and the source due to a drain current of the fifth NMOS transistor as the second bias voltage.

5. An amplifier circuit according to claim 1, wherein the first transconductance amplifier includes a first NMOS transistor which has a source thereof connected to the second power source and functions as a constant current source, a second NMOS transistor which has a source thereof connected to a drain of the first NMOS transistor, uses a gate thereof as an input for the first bias voltage, and uses a drain thereof as an output of the first transconductance amplifier, and a third NMOS transistor which has a source thereof connected to a drain of the first NMOS transistor, uses a gate thereof as an input for an output of the differential amplifier, and has a drain thereof connected to the first power source;
    wherein the second transconductance amplifier includes a first PMOS transistor which has a source thereof connected to the first power source and functions as a constant current source, a second PMOS transistor which has a source thereof connected to a drain of the first PMOS transistor, uses a gate thereof as an input for the second bias voltage, and has a drain thereof connected to the second power source, and a third PMOS transistor which has a source thereof connected to a drain of the first PMOS transistor, and connects a gate thereof to a drain of the second NMOS transistor which constitutes an output of the first transconductance amplifier, a first current mirror circuit which is constituted of NMOS transistors which have respective sources thereof connected to the second power source, have a gate and a drain of one NMOS transistor connected to a drain of a third PMOS transistor as inputs, and use a drain of another NMOS transistor as an output, and a second current mirror circuit which is constituted of PMOS transistors which have respective sources connected to the first power source, have a gate and a drain of one PMOS transistor connected to an output of the current mirror circuit, and have a drain of another PMOS transistor connected to an output of the first current mirror circuit as an input and another drain connected to an output of the first transconductance amplifier as an output; and wherein the first output transistor is constituted of a PMOS transistor and the second output transistor is constituted of an NMOS transistor.

\* \* \* \* \*